United States Patent
Hsieh

(10) Patent No.: US 7,567,679 B2
(45) Date of Patent: Jul. 28, 2009

(54) SYSTEM AND METHOD FOR CONTROLLING SOUND VOLUME

(75) Inventor: Kuan-Hong Hsieh, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 923 days.

(21) Appl. No.: 10/978,865

(22) Filed: Oct. 29, 2004

(65) Prior Publication Data

US 2006/0050899 A1    Mar. 9, 2006

(30) Foreign Application Priority Data

Jul. 9, 2004    (TW) ............................. 93120626 A

(51) Int. Cl.
*H03G 3/00* (2006.01)

(52) U.S. Cl. .................. 381/109; 381/104; 381/105; 700/94

(58) Field of Classification Search ......... 381/104–109, 381/101, 102; 700/94
See application file for complete search history.

(56) References Cited

U.S. PATENT DOCUMENTS

| | | | | |
|---|---|---|---|---|
| 5,054,071 A | | 10/1991 | Bacon | 381/12 |
| 5,303,371 A | * | 4/1994 | Nakajima | 381/109 |
| 5,355,531 A | * | 10/1994 | Iwata et al. | 455/219 |
| 5,428,267 A | * | 6/1995 | Peil | 315/224 |
| 5,633,940 A | * | 5/1997 | Wassink | 381/107 |
| 6,396,549 B1 | * | 5/2002 | Weber | 348/734 |
| 6,944,284 B2 | * | 9/2005 | Goodings | 379/373.02 |
| 2004/0022401 A1 | * | 2/2004 | Watanabe et al. | 381/109 |
| 2004/0052385 A1 | | 3/2004 | Lim et al. | 381/104 |

\* cited by examiner

*Primary Examiner*—Vivian Chin
*Assistant Examiner*—Disler Paul

(57) ABSTRACT

A system for controlling volume includes: a key input unit (1) for receiving user operations, and generating a corresponding controlling signal according to each operation; an MCU (Microprogrammed Control Unit) (2) for comparing an elapsed time of the user continuously operating the key input unit with a preset time, and generating PWM (Pulse-Width Modulation) pulses according to the comparison result; and a volume effect IC (Integrated Circuit) (3) for adjusting volume by 1 unit according to the PWM pulses if the elapsed time is less than or equal to the preset time, and setting volume as mute or adjusting volume by 10 units if the elapsed time is greater than the preset time according to a predefined system status during which the user presses the key input unit. The MCU includes a CPU (Central Processing Unit)(20), a timer (22), and a memory (23). A related method is also disclosed.

12 Claims, 5 Drawing Sheets

US 7,567,679 B2

SYSTEM AND METHOD FOR CONTROLLING SOUND VOLUME

BACKGROUND OF THE INVENTION

1. Field of the Invention

The present invention relates to electronic systems and methods for controlling volume of audio output devices, and particularly to a system and method for controlling sound volume according to an elapsed time of operation of a manual input unit.

2. Background of the invention

Presently, there are many kinds of audio output apparatuses used for amplifying audio signals of devices such as loudhailers, TVs and MP3 (Moving Picture Experts Group, audio layer 3) players. These audio output apparatuses are known as "audio frequency amplifier apparatus," and are used to adjust the output voltage of the device according to manual adjustment operations and corresponding adjustment commands.

A conventional audio output apparatus provides a single key for adjusting volume, and a separate muting key for muting the volume. The apparatus cannot simultaneously adjust volume and perform muting by operation of a single key. Additionally, the apparatus generally adjusts volume from a minimum amount to a maximum amount level by level. This takes much time, which often inconveniences users.

Accordingly, what is needed is a system and method for quickly and conveniently adjusting volume according to user need.

SUMMARY OF THE INVENTION

A main objective of the present invention is to provide a system and method for efficiently and quickly adjusting sound volume and setting volume as mute according to an elapsed time that a user continuously operates a key input unit.

To accomplish the above objective, a system for controlling sound volume in accordance with a preferred embodiment of the present invention comprises: an key input unit for receiving a user operation, generating a controlling signal according to each operation, and transmitting the controlling signal; an MCU (Microprogrammed Control Unit) for determining a mode of adjusting volume according to the controlling signal and an elapsed time of the user continuously operating the key input unit; and a volume effect IC (Integrated Circuit) for setting volume as mute or adjusting volume according to the PWM pulses. The key input unit comprises an "increase" key and a "decrease" key. The MCU comprises a timer for recording the elapsed time of the user continuously operating the key input unit, a memory for storing controlling programs, a PWM (Pulse-Width Modulation) pin; and a CPU (Central Processing Unit) for receiving the controlling signal, comparing the elapsed time with a preset time, generating PWM pulses with a corresponding duty ratio according to the comparison result, and transmitting the PWM pulses via the PWM pin. The volume effect IC adjusts volume by 1 unit if the elapsed time is less than or equal to the preset time, sets volume as mute if the elapsed time is greater than the preset time during a preliminary status of the system, and adjusts volume by 10 units if the elapsed time is greater than the preset time during a volume adjusting status of the system.

In addition, the present invention provides a method for controlling sound volume using the above-described system, the method comprising the steps of: (a) providing a key input unit comprising an "increase" key and a "decrease" key, for receiving a user operation and generating a corresponding controlling signal according to the operation; (b) providing an MCU to determine whether an elapsed time of the user continuously operating the key input unit is greater than a preset time; (c) adjusting volume by a first amount if the elapsed time is less than or equal to the preset time; (d) adjusting volume by a second amount if the elapsed time of the user pressing the "increase" key is greater than the preset time; and (e) setting mute if the elapsed time of the user pressing the "decrease" key is greater than the preset time.

Further, the present invention provides another method for controlling sound volume using the above-described system, the method comprising the steps of: (a) providing a key input unit for receiving a user operation, and generating a controlling signal according to the operation; (b) providing an MCU to determine whether an elapsed time of the user continuously operating the key input unit is greater than a preset time; (c) adjusting volume by a first amount if the elapsed time is less than or equal to the preset time; and (d) adjusting volume by a second amount if the elapsed time is greater than the preset time.

In summary, the system and method for controlling volume are quick and efficient, without the need for adjusting volume level by level.

Other objects, advantages and novel features of the present invention will be drawn from the following detailed description with reference to the attached drawings, in which:

DETAILED DESCRIPTION OF THE INVENTION

Figure 1:
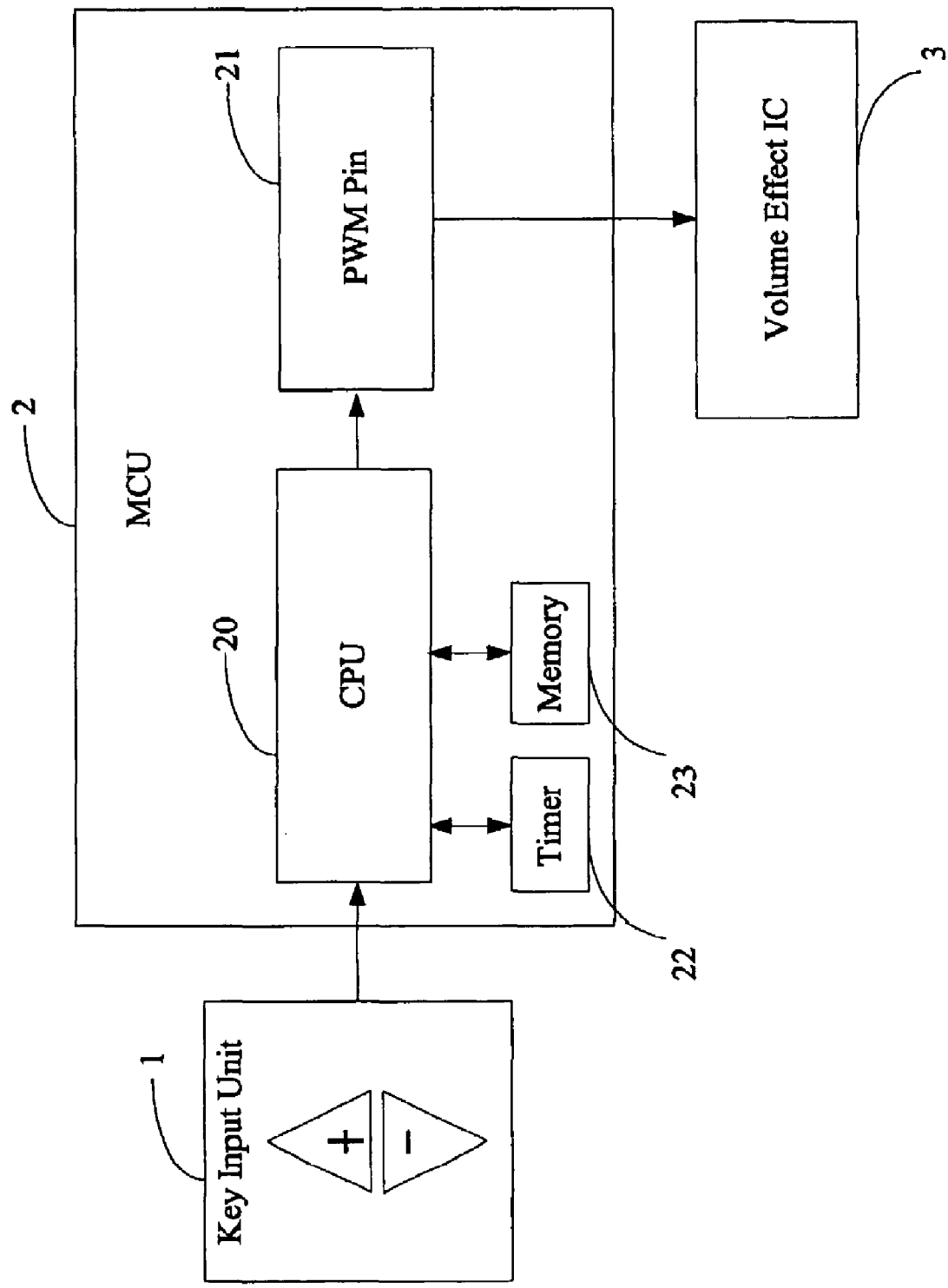
FIG. 1 is a block diagram of hardware infrastructure of a system for controlling sound volume in accordance with the preferred embodiment of the present invention, the system comprising a key input unit.

FIG. 1 is a block diagram of hardware infrastructure of the system for controlling sound volume (hereinafter, "the system") in accordance with the preferred embodiment of the present invention. The system comprises a key input unit 1, an MCU (Microprogrammed Control Unit) 2, and a volume effect IC (Integrated Circuit) 3. A user performs press operations on the key input unit 1. The key input unit 1 then generates a controlling signal according to each operation, and transmits the controlling signal to the MCU 2. The key input unit 1 comprises an "increase" key (symbolically depicted as a "+" key) and a "decrease" key (symbolically depicted as a "−" key). The MCU 2 controls the volume effect IC 3 to adjust volume according to the controlling signal and an elapsed time of a user continuously operating the key input unit 1. The MCU 2 comprises a CPU (Central Processing Unit) 20, a PWM (Pulse-Width Modulation) pin 21, a timer 22, and a memory 23. The CPU 20 receives the controlling signal from the key input unit 1, compares the elapsed time with a preset time $T_1$, generates PWM pulses with a corresponding duty ratio according to the comparison results, and transmits the PWM pulses to the volume effect IC 3 via the PWM pin 21. The elapsed time equals a time of the user continuously pressing the key input unit 1, and is recorded by the timer 22. The memory 23 stores controlling programs.

The memory 23 may be a ROM (Read-only Memory), a RAM (Random Access Memory), a volatile memory (such as DRAM, SRAM), or a non-volatile memory (such as EPROM, Flash memory). The volume effect IC 3 sets volume as mute or adjusts volume according to the PWM pulses from the CPU 20. In the preferred embodiment, the total volume is set as 100 units, thereby the changeable volume of each unit is set as 1. When the elapsed time is less than or equal to the preset time $T_1$, the volume effect IC 3 adjusts volume by 1 unit. When the elapsed time is greater than the preset time $T_1$, the volume effect IC 3 sets volume as mute or adjusts volume by 10 units according to a system status during which the user presses the key input unit 1. The status is either a preliminary status or a volume adjusting status. The preliminary status is also called "normal working status." The preliminary status means that nobody operates the key input unit 1; and in the case where the system is used in a device such as a TV, an OSD (On-Screen Display) is not shown. The volume adjusting status means that the user operates the key input unit 1, and the OSD is shown.

Figure 2:
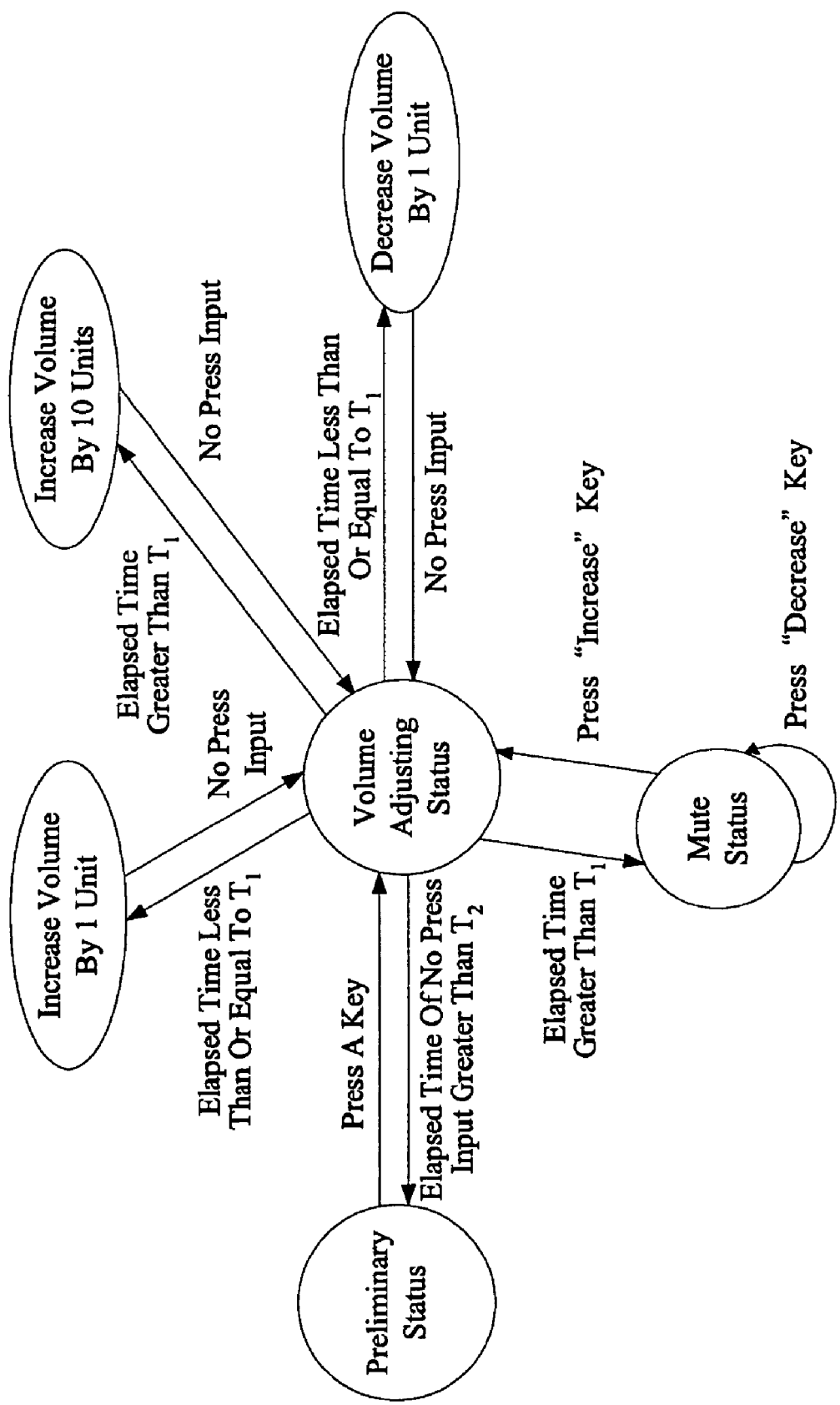
FIG. 2 is a schematic diagram showing different modes of adjusting volume when a user operates the key input unit during a preliminary status of the system.

FIG. 2 is a schematic diagram showing different modes of adjusting volume when the user operates the key input unit 1 during the preliminary status. When the user presses the "increase" key on the key input unit 1, the system enters the volume adjusting status, and the volume effect IC 3 increases volume by 1 unit if an elapsed time of pressing the key is less than or equal to the preset time $T_1$. Then the system returns to the volume adjusting status as soon as the user releases the "increase" key. Alternatively, the volume effect IC 3 increases volume by 10 units if the elapsed time is greater than the preset time $T_1$. Then the system returns to the volume adjusting status as soon as the user releases the "increase" key. In contrast, when the user presses the "decrease" key in the key input unit 1, the system enters the volume adjusting status, the volume effect IC 3 decreases volume by 1 unit if the elapsed time is less than or equal to the preset time $T_1$. Then the system returns to the volume adjusting status as soon as the user releases the "decrease" key. Alternatively, the volume effect IC 3 sets volume as mute if the elapsed time is greater than the preset time $T_1$. If the user presses the "increase" key while the system is mute, the system is recovered to a former volume, and returns to the volume adjusting status. In contrast, if the user presses the "decrease" key while the system is mute, the system maintains mute. The system returns to the preliminary status from the volume adjusting status when an elapsed time of no press input is greater than a preset time $T_2$.

Figure 3:
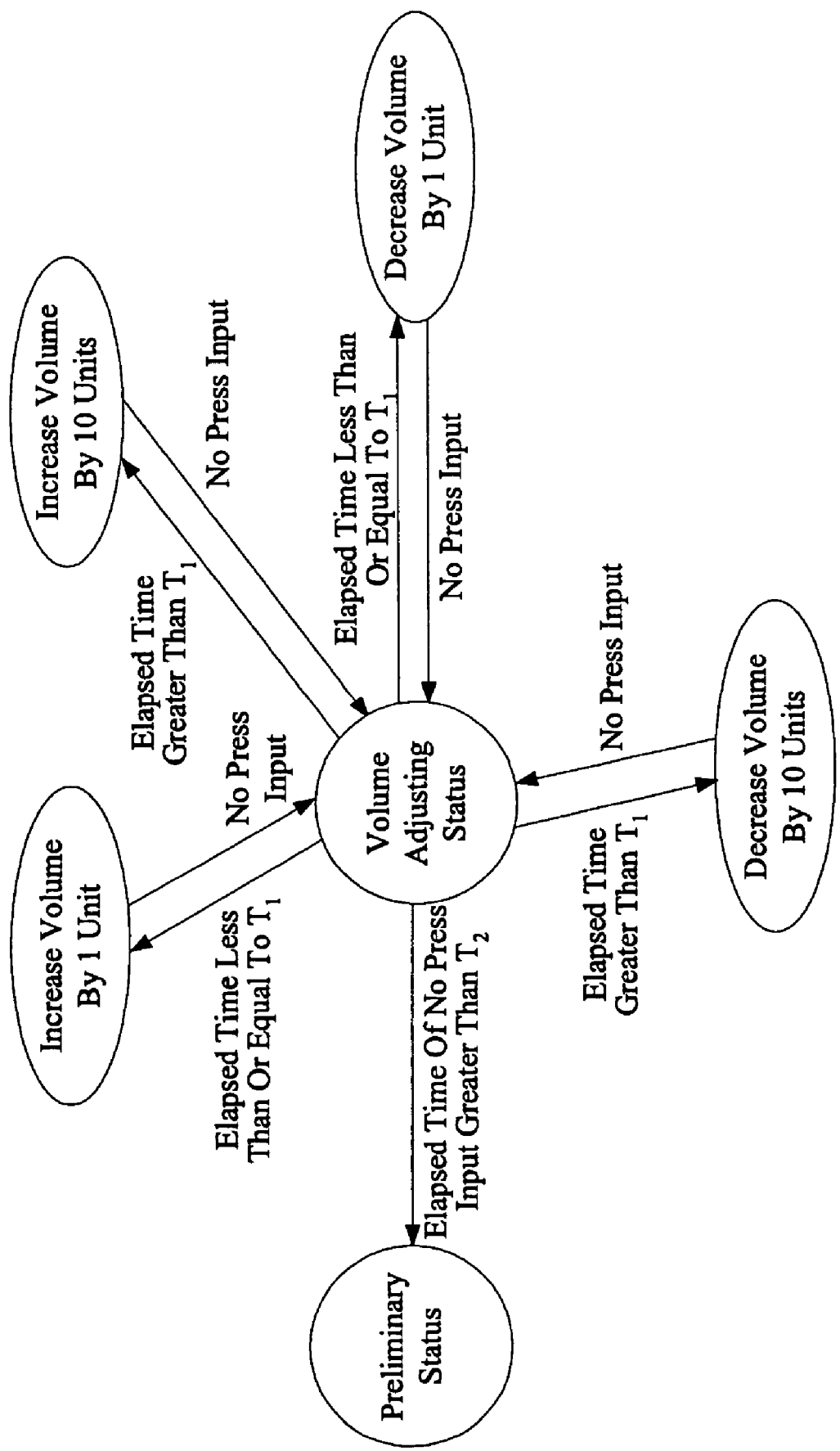
FIG. 3 is a schematic diagram showing different modes of adjusting volume when the user operates the key input unit during a volume adjusting status of the system.

FIG. 3 is a schematic diagram showing different modes of adjusting volume when the user operates the key input unit 1 during the volume adjusting status. When the user presses the "increase" key on the key input unit 1, the volume effect IC 3 increases volume by 1 unit if an elapsed time of pressing the key is less than or equal to the preset time $T_1$. Then the system returns to the volume adjusting status as soon as the user releases the "increase" key. Alternatively, the volume effect IC 3 increases volume by 10 units if the elapsed time is greater than the preset time $T_1$. Then the system returns to the volume adjusting status as soon as the user releases the "increase" key. In contrast, when the user presses the "decrease" key on the key input unit 1, the volume effect IC 3 decreases volume by 1 unit if the elapsed time of pressing the key is less than or equal to the preset time $T_1$. Then the system returns to the volume adjusting status as soon as the user releases the "decrease" key. Alternatively, the volume effect IC 3 decreases volume by 10 units if the elapsed time is greater than the preset time $T_1$. Then the system returns to the volume adjusting status as soon as the user releases the "decrease" key. The system enters the preliminary status from the volume adjusting status when an elapsed time of no press input is greater than the preset time $T_2$.

Figure 4:
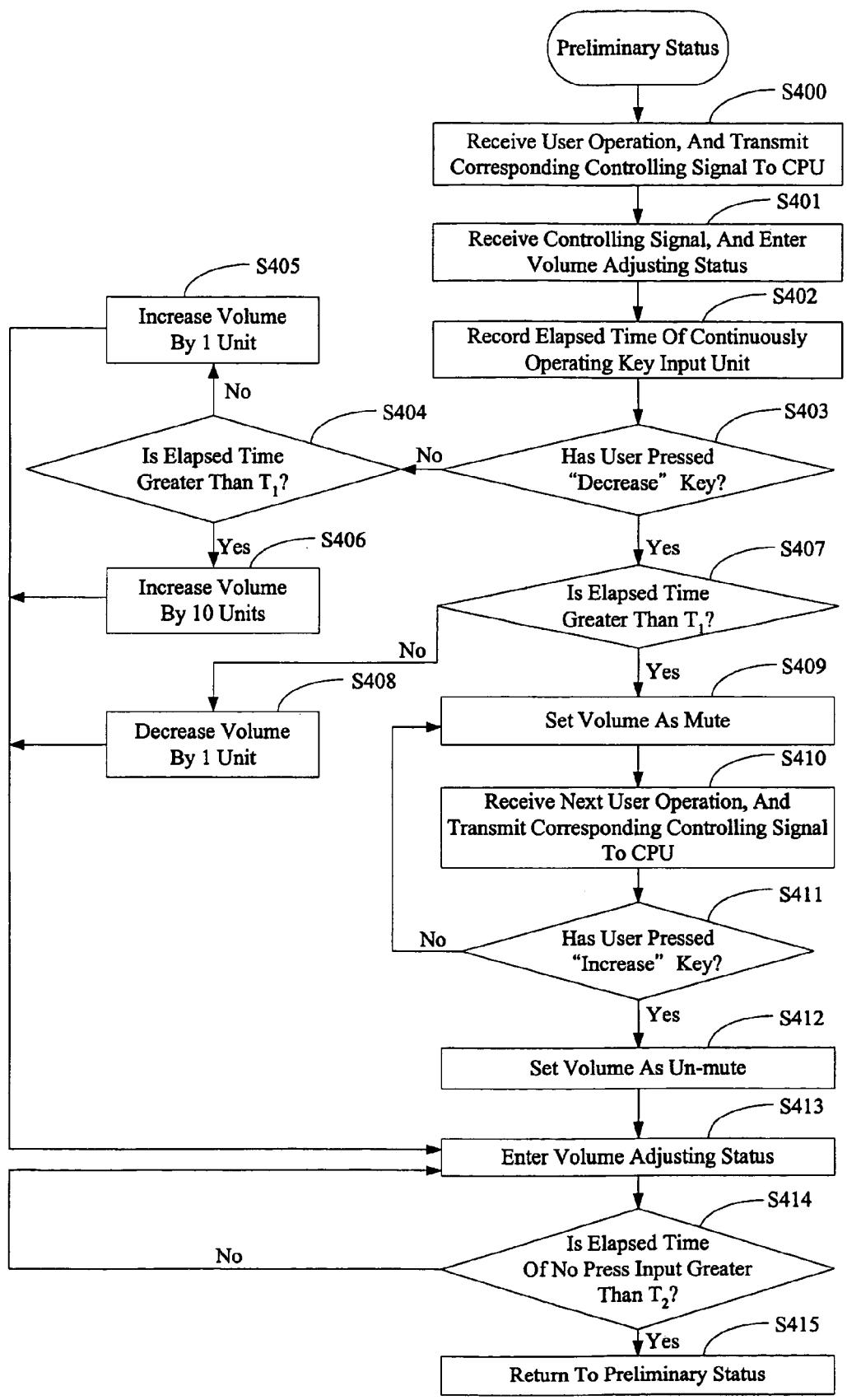
FIG. 4 is a flowchart of operating the key input unit to adjust volume during the preliminary status.

FIG. 4 is a flowchart of operating the key input unit 1 to adjust volume during the preliminary status. In step S400, the key input unit 1 receives a user operation, and transmits a corresponding controlling signal to the CPU 2. In step S401, the CPU 20 receives the controlling signal, and the system enters the volume adjusting status. In step S402, the timer 22 records an elapsed time of the user continuously operating the key input unit 1. In step S403, the CPU 20 determines whether the user has pressed the "decrease" key, according to the controlling signal. If the user has pressed the "decrease" key, the procedure goes directly to step S407 described below. Otherwise, if the user has pressed the "increase" key, in step S404, the CPU 20 determines whether the elapsed time is greater than the preset time $T_1$. If the elapsed time is less than or equal to the preset time $T_1$, in step S405, the CPU 2 generates PWM pulses with a corresponding duty ratio, and transmits the PWM pulses to the volume effect IC 3 via the PWM pin 21. Then, the volume effect IC 3 increases volume by 1 unit according to the PWM pulses, whereupon the procedure goes to step S413 described below. If the elapsed time is greater than the preset time $T_1$, in step S406, the volume effect IC 3 increases volume by 10 units, whereupon the procedure goes to step S413 described below.

In step S407, the CPU 20 determines whether the elapsed time of the user continuously pressing the "decrease" key is greater than the preset time $T_1$. If the elapsed time is less than or equal to the preset time $T_1$, in step S408, the volume effect IC 3 decreases volume by 1 unit, whereupon the procedure goes to step S413 described below. If the elapsed time is greater than the preset time $T_1$, in step S409, the volume effect IC 3 sets volume as mute. In step S410, the key input unit 1 receives a next user operation, and transmits a corresponding controlling signal to the CPU 2. In step S411, the CPU 20 receives the controlling signal, and determines whether the user has pressed the "increase" key, according to the controlling signal. If the user has pressed the "decrease" key, the procedure returns to step S409 described above, and the system maintains mute. If the user has pressed the "increase" key, in step S412, the volume effect IC 3 sets volume as un-mute, and the system is recovered to a former volume, whereupon the procedure goes to step S413.

In step S413, the system enters the volume adjusting status. In step S414, the CPU 20 determines whether an elapsed time of no press input is greater than the preset time $T_2$. If the elapsed time is less than or equal to the preset time $T_2$, the procedure returns to step S413. If the elapsed time is greater than the preset time $T_2$, in step S415, the system returns to the preliminary status.

Figure 5:
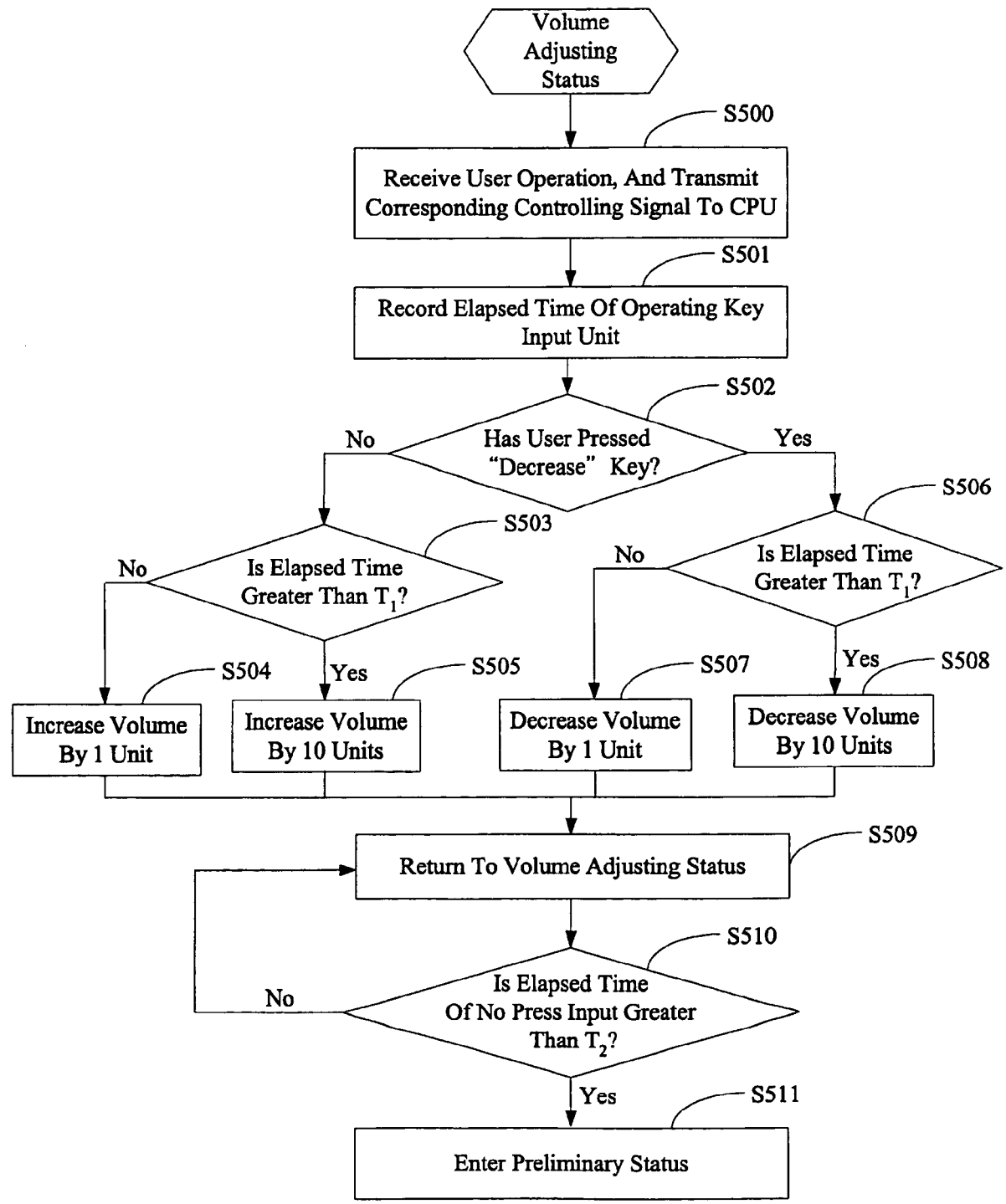
FIG. 5 is a flowchart of operating the key input unit to adjust volume during the volume adjusting status.

FIG. 5 is a flowchart of operating the key input unit 1 to adjust volume during the volume adjusting status. In step S500, the key input unit 1 receives a user operation, and transmits a corresponding controlling signal to the CPU 20. In step S501, the timer 22 records an elapsed time of the user continuously operating the key input unit 1. In step S502, the CPU 20 determines whether the user has pressed the "decrease" key, according to the controlling signal. If the user has pressed the "decrease" key, the procedure goes to step S506 described below. Otherwise, if the user has pressed the "increase" key, in step S503, the CPU 20 determines whether the elapsed time is greater than the preset time $T_1$. If the elapsed is less than or equal to the preset time $T_1$, in step S504, the CPU 2 generates PWM pulses with a corresponding duty ratio, and transmits the PWM pulses to the volume effect IC 3 via the PWM pin 21. Then the volume effect IC 3 increases volume by 1 unit according to the PWM pulses, whereupon the procedure goes directly to step S509 described below. If the elapsed time is greater than the preset time $T_1$, in step S505, the volume effect IC 3 increases volume by 10 units, whereupon the procedure goes directly to step S509 described below.

In step S506, the CPU 20 determines whether the elapsed time of the user pressing the "decrease" key is greater than the preset time $T_1$. If the elapsed time is less than or equal to the preset time $T_1$, in step S507, the volume effect IC 3 decreases volume by 1 unit, whereupon the procedure goes directly to step S509 described below. If the elapsed time is greater than the preset time $T_1$, in step S508, the volume effect IC 3 decreases volume by 10 units, whereupon the procedure goes to step S509.

In step S509, the system returns to the volume adjusting status. In step S510, the CPU 20 determines whether an elapsed time of no press input is greater than the preset time $T_2$. If the elapsed time is less than or equal to the preset time $T_2$, the procedure returns to step S509. If the elapsed time is greater than the preset time $T_2$, in step S511, the system enters the preliminary status.

Although the present invention has been specifically described on the basis of a preferred embodiment and preferred methods, the invention is not to be construed as being limited thereto. Various changes or modifications may be made to the embodiment and methods without departing from the scope and spirit of the invention.

What is claimed is:

1. A system for controlling sound volume, the system comprising a key input unit, an MCU (Microprogrammed Control Unit), and a volume effect IC (Integrated Circuit), wherein:
    the key input unit is configured for receiving user operations, generating a corresponding controlling signal according to each operation, and transmitting the controlling signal to the MCU;
    the MCU is configured for determining a mode of adjusting volume according to the controlling signal and an elapsed time of the user continuously operating the key input unit, the MCU comprising:
        a timer configured for recording the elapsed time;
        a memory configured for storing controlling programs; and
        a CPU (Central Processing Unit) configured for receiving the controlling signal, comparing the elapsed time with a preset time, generating PWM (Pulse-Width Modulation) pulses with a corresponding duty ratio according to the comparison result, and transmitting the PWM pulses to the volume effect IC;
    the volume effect IC is configured for setting the volume as mute if the elapsed time is greater than the preset time according to the PWM pulses when the system is at a preliminary status or adjusting volume by a first amount if the elapsed time is less than or equal to the preset time, and adjusting volume by a second amount if the elapsed time is greater than the preset time according to the PWM pulses when the system is at a volume adjusting status; and
    wherein the key input unit comprises a "increase" key and a "decrease" key, the volume effect IC is configured for setting volume as mute if the elapsed time of pressing the "decrease" key is greater tham the preset time, and adjusts volume by the first amount if the elapsed time of pressing the "increase" key or the "decrease" key is less than or equal to the preset time, and adjusts volume by the second amount if the elapsed time of pressing the "increase" key is greater than the preset time when the system at the preliminary status.

2. The system according to claim 1, wherein the memory is selected from the group consisting of a ROM (Read-Only Memory), a RAM (Random Access Memory), a volatile memory. and a non-volatile memory.

3. The system according to claim 1, wherein the CPU is configured for transmitting the PWM pulses to the volume effect IC via a PWM pin.

4. The system according to claim 1, the volume effect IC is also configured for adjusting volume by a first amount if the elapsed time of pressing the "increase" key or the "decrease" key is less than or equal to the preset time, and adjusts volume by a second amount if the elapsed time of pressing the "increase" key or the "decrease" key is greater than the preset time when the system at the volume adjusting status.

5. The system according to claim 1, wherein the system is changed from the preliminary status to the volume adjusting status immediately after the "increase" key or the "decrease" key is released in the preliminary status.

6. The system according to claim 4, wherein the system is changed to the preliminary status from the volume adjusting status when an elapsed time of no press input is greater than another preset time.

7. A method for controlling sound volume through a system, the system comprising a key input unit comprising an "increase" key and a "decrease" key for receiving a user operation, the system comprising a preliminary status and a volume adjusting status, the method comprising the steps of:
    determining whether an elapsed time of the user continuously operating the key input unit is greater than a preset time using a timer;
    adjusting volume by a first amount if the elapsed time is less than or equal to the preset time;using a volume effect circuit
    adjusting volume by a second amount if the elapsed time of user pressing the "increases" key is greater than the preset time; and
    setting volume as mute if the elapsed time of the user pressing the "decrease" key is greater than the preset time when the system is at the preliminary status and adjusting volume by the second amount if the elapsed time of the user pressing the "decrease" key is greater than the preset time when the system is at the volume adjusting status.

8. The method according to claim 7, further comprising the step of providing a timer for recording the elapsed time of the user continuously operating the key input unit.

9. The method according to claim 7, further comprising the step of setting volume as un-mute, and recovering to a former volume when the user operates the "increase" key while volume is mute.

10. The method according to claim 7, further comprising the step of maintaining mute when the user operates the "decrease" key while volume is mute.

11. The method according to claim 7, further comprising changing the system from the preliminary status to the volume adjusting status immediately after the "increase" key or the "decrease" key is released.

12. The method according to claim 7, further comprising changing the system from the volume adjusting status to the preliminary status when an elapsed time of no press input is greater than another preset time.

* * * * *